(12) United States Patent
Johnson et al.

(10) Patent No.: US 6,605,406 B2
(45) Date of Patent: Aug. 12, 2003

(54) IMAGEABLE PHOTORESIST LAMINATE

(75) Inventors: Kyle Johnson, Duluth, MN (US);
Toshifumi Komatsu, Duluth, MN (US);
Jeremy William Peterson, Duluth, MN (US)

(73) Assignee: The Chromaline Corporation, Duluth, MN (US)

( * ) Notice: Subject to any disclaimer, the term of this patent is extended or adjusted under 35 U.S.C. 154(b) by 0 days.

(21) Appl. No.: 09/845,037

(22) Filed: Apr. 27, 2001

(65) Prior Publication Data
US 2002/0115014 A1 Aug. 22, 2002

Related U.S. Application Data

(60) Provisional application No. 60/200,458, filed on Apr. 28, 2000.

(51) Int. Cl.$^7$ ............................................. G03F 7/012
(52) U.S. Cl. ..................... 430/167; 430/195; 430/258; 430/262; 430/263; 430/291
(58) Field of Search ................................ 430/167, 195, 430/325, 258, 262, 263, 291

(56) References Cited

U.S. PATENT DOCUMENTS

| | | | |
|---|---|---|---|
| 4,241,162 A | * 12/1980 | Hatano et al. | 430/195 |
| 4,356,247 A | * 10/1982 | Aotani et al. | 430/195 |
| 4,764,449 A | 8/1988 | VanIseghem | 430/162 |
| 5,415,971 A | 5/1995 | Couture et al. | 430/260 |
| 5,477,105 A | * 12/1995 | Curtin et al. | 313/268 |
| 5,866,296 A | * 2/1999 | Shibuya et al. | 430/195 |
| 5,989,689 A | 11/1999 | Komatsu | 428/201 |
| 6,020,093 A | 2/2000 | Shibuya et al. | 430/7 |

* cited by examiner

*Primary Examiner*—John S. Chu
(74) *Attorney, Agent, or Firm*—Merchant & Gould P.C.

(57) ABSTRACT

A photosensitive laminate structure including a carrier layer and a photosensitive layer is described. The photosensitive layer includes a polymeric photosensitive resin composition containing at least one cross-linkable unit represented by the formula:

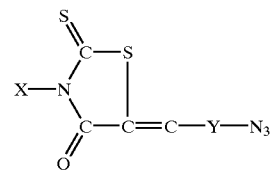

wherein X is an organic moity and Y is selected from the following group:

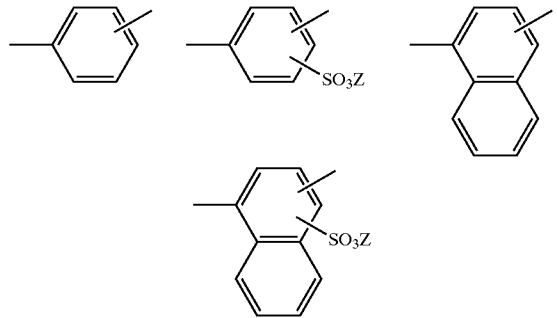

wherein Z is selected from at least one of lithium, sodium, potassium, ammonium, monoalkylammonium, dialkylammonium, and tetraalkylammonium.

13 Claims, 1 Drawing Sheet

IMAGEABLE PHOTORESIST LAMINATE

This application claims the benefit of provisional application No. 60/200,458 filed Apr. 28, 2000.

FIELD OF THE INVENTION

The present invention relates to improved imageable photoresist laminates for use in abrasion etching applications. More particularly, the invention relates to durable imageable photoresist laminates containing a rhodanine-based crosslinkable resin.

BACKGROUND OF THE INVENTION

Photosensitive laminate structures have been used for many years to create imageable patterns useful for abrasion etching of substrate materials. The laminates contain photosensitive resins that are crosslinked by actinic radiation. Ultraviolet or visible light is used to imagewise expose these laminates and form a durable image in the laminate structure. The exposed images are subsequently developed to remove unexposed material. Thereafter the laminate is transferred to a substrate surface for selective surface modification, such as by abrasive etching using sandblasting techniques.

One of the main materials used in photoresist laminates is photosensitive resins. Two commonly used types of photosensitive resins are those containing diazonium salts and strylpyridinium salts. Diazonium salt materials, when contacted by ultraviolet light, yield one molecule of nitrogen per diazonium group and generate active crosslinking species. Commonly used diazonium photoinitiated crosslinkers include paradiazodiphenylamine salts. One advantage of diazonium salt compositions is that they undergo a color change upon exposure to actinic radiation. This color change is useful because it provides a printout image that can be used to position the laminate during placement on a substrate.

Although diazonium salt materials are suitable for many photosensitive laminate applications, a need exits for a material that cures more rapidly than diazonium salts. In addition, some diazonium salts show inadequate storage and stability properties. The other common photosensitive resin can include stibazole-containing materials. These stibazole materials may be present in the form of salts of acids such as a hydrochloride, hydrobromide, perchlorate, tetrafluoroborate, phosphate, and sulfate. Styrylpyridinium salt compositions typically have improved curing speed and stability compared to diazonium compositions. However, styrylpyridinium salt compositions usually do not change color to form a print out image, and are therefore often more difficult to position than diazonium compositions. In addition, styrylpyridinium compositions often lack adequate strength and durability for some applications.

A further problem with both of these resin materials, and resin materials in general, is that they sometimes undergo blocking or bricking, in which multiple laminates adhere together during storage. Such undesirable adherence can be a significant obstacle to storing and using the laminate materials.

Therefore, a need exists for improved photosensitive laminates utilizing photoresist resins other than diazonium salts and strylpyridinium salts. Such laminates are preferably fast curing, stable, non-blocking, and produce a print out image upon exposure to actinic radiation. In addition, the laminates should have sufficient mechanical and abrasive strength to withstand erosive exposure, such as exposure to sandblasting materials.

BRIEF DISCUSSION OF THE INVENTION

The present invention relates to photosensitive laminates. In specific implementations the invention relates to a photosensitive laminate comprising a carrier or substrate and an imageable photosensitive layer. The laminate may also comprise an intermediate membrane between the photosensitive layer and the carrier material. The photosensitive layer includes a resin containing the following functional unit:

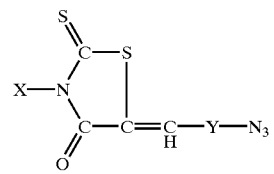

wherein X is an organic moity and Y is selected from the following groups:

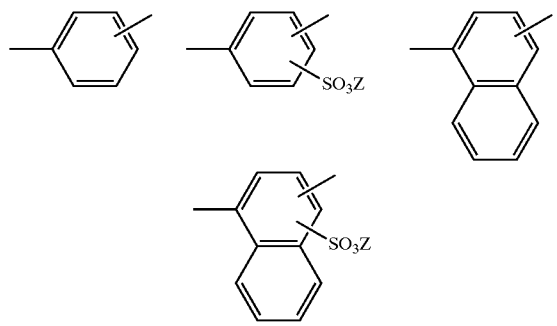

wherein Z is selected from at least one of lithium, sodium, potassium, ammonium, monoalkylammonium, dialkylammonium, and tetraalkylammonium.

These resin compositions are typically rhodanine-based crosslinkable resins, and include compositions having the functional unit:

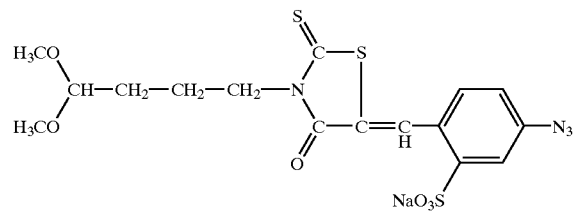

In use, the imageable photosensitive layer structure can be imagewise exposed to actinic radiation to form a durable image which is subsequently developed by aqueous washing to remove unexposed photosensitive resin. This image can then be transferred to a surface for appropriate surface modification, such as by sandblasting.

For the purposes of this application, the term "carrier" and "carrier layer" typically refers to a film or other thin layer upon which the photosensitive layer is formed. The term "substrate" typically refers to an object that is modified, blasted, etc., using a process like sandblasting with a mask formed from the photoimaged laminate of the invention. "Image" and "image transfer" typically refers to the image formed in the photosensitive layer.

The invention can be embodied in various structures. In one structure, the carrier layer is coated with a membrane layer, and the photosensitive layer is applied over the membrane layer. In another structure, a carrier layer is directly coated with the photosensitive layer. These laminate structures can have other functional layers to improve processability, photoimaging, or surface modification.

Additional aspects of the invention are processes for forming an image using the laminate structure of the invention. In one process, the laminate structure is first exposed to actinic radiation, and then developed, processed and transferred to a substrate surface for modification, such as by sand blasting. After the etching or other modification is complete and a pattern is fully formed in a surface of an object, the remaining imaged portions of the laminate can be removed either mechanically or chemically from the surface of the object by gentle cleaning.

Figure 1:
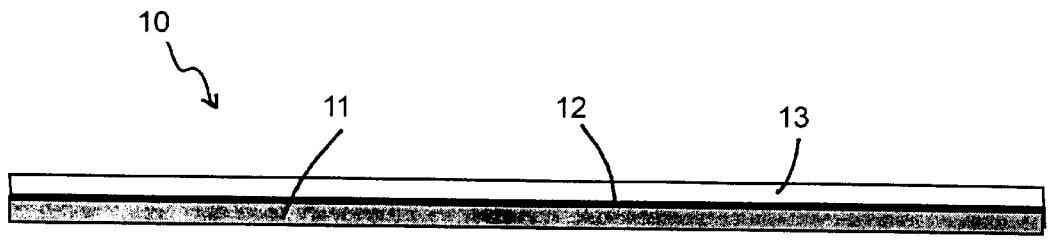
FIG. 1 is a view of a generally rectangular portion of a preferred three layer laminate of the invention containing a carrier layer, a membrane layer, and a photosensitive layer.

DETAILED DISCUSSION OF THE INVENTION
Film or Carrier Layer

The film or carrier layer of the invention comprises a web, film or other relatively thin material which can be coated with the membrane or photosensitive composition of the invention. This film or carrier layer should typically be mechanically strong enough to permit rapid coating manufacture of the resist laminate, but should also be processable by exposure processing and imaging environments of the invention.

Suitable sheet-like film or support layers can comprise transparent films. These films are typically about 0.05 to 0.3 mm (2 to 10 mils) thick and can be made from a variety of natural or synthetic materials, including treated cellulose, paper, polyolefin resins, polyester resins, and polyvinylchloride resins. Suitable sheet-like materials for use in this invention are typically thin, less than 0.13 mm, such as polyethylene terephalate polyester (Mylar®) sheets less than 0.08 mm thick.

Photosensitive Layer

The photoimageable laminate of the invention includes a photosensitive layer. The photosensitive layer contains a negative photosensitive material that interacts with light to transform the composition from a soluble state to a substantially less soluble state. Substances in the photosensitive layer crosslink when exposed to a sufficient quantity of actinic radiation. Such crosslinking reactions render the exposed photosensitive material less soluble or substantially less soluble to the action of water. The radiation is directed into the photosensitive layer in an imagewise manner to form selectively insoluble regions for imaging purposes.

The photosensitive layer includes a polymeric photosensitive resin containing at least one cross-linkable unit represented by the formula:

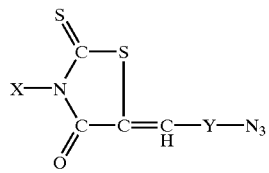

wherein X is an organic moity and Y is selected from the following groups:

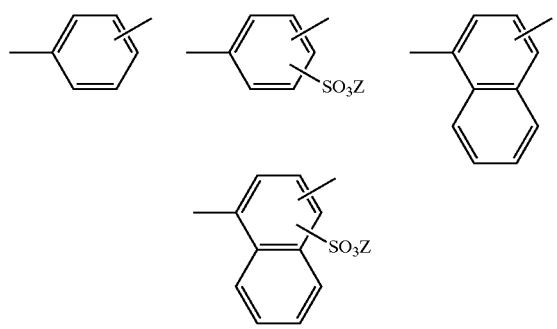

wherein Z is selected from at least one of lithium, sodium, potassium, ammonium, monoalkylammonium, dialkylammonium, and tetraalkylammonium. In specific implementations the cross-linkable unit comprises:

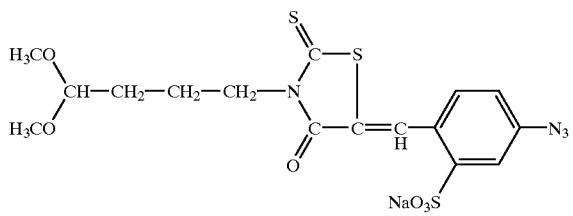

The photosensitive polymer compound of the present invention having a unit of the above-described formula can be obtained through condensation of a variety of rhodanine compounds. Suitable methods and materials are disclosed in U.S. Pat. No. 6,020,093 to Shibuya et al., incorporated in its entirety herein by reference.

The photosensitive resin compositions can optionally contain other functional materials including surfactants, defoamers, dyes, antioxidants and other additives that aid in the formation of a thin uniform layer without holes, thin spots or other variations in the thin uniform layer. The photosensitive layer can also contain a film forming polymeric binder, optionally a plasticizer, and other materials such as a surfactant, a defoamer, a dye, an antioxidant, a perfume or other functional materials. The filler, antioxidant, and dye or pigment optionally used in the invention should not interfere significantly with the photoimaging and photohardening of the polymeric material.

The photoresist compositions of the invention can further include a film forming polymeric binding agent. During photocrosslinking of the composition, the binding agent is entrapped in a mesh formed by the crosslinking polymeric materials. Typically, polymeric binding agents comprise relatively water insoluble polymers that can be formed into latices or stable suspensions of small particles in water or aqueous media. Suitable binding agents include carboxymethyl cellulose, partially hydrolyzed polyvinyl alcohols, water insoluble homopolymers and copolymers made of such materials as styrene, methylmethacrylate, vinyl acetate, acrylic materials, acrylate materials, vinyl butyrl, vinyl pyrrolidone, ethylene, propylene, alkylene oxide monomers and other monomers. Preferred polymeric binding agents comprise polyvinyl acetates for reasons of compatibility with polyvinyl alcohol polymers, economy, and stability of their suspensions in aqueous media. A representative, non-limiting list of such materials includes polyvinyl acetate, a polyethylene-vinyl acetate copolymer, ethyl cellulose, and cellulose acetate. The binding resin should be removable in the developer, and preferably, the binding resin is water dispersible.

The photoresist compositions can contain plasticizer components that help in providing resiliency and adhesion to the layers, and which permit the layers to resist flaking and delamination during use. Any plasticizer which does not interfere significantly with the photoimaging and photohardening of the polymeric material may be used in the photosensitive, adhesive layer or film. A representative, non-limiting list of such materials includes phthalates, benzoates, phosphates, adipates, sebacate esters, and polyols such as ethylene glycol and its derivatives. Typically the photosensitive layer contains about 0.1 to about 75 wt %, preferably about 5 to 35 wt % of the photopolymerizable resin.

The photosensitive resist materials of the invention can be made by coating the aqueous materials on a support layer or film. In one mode for manufacturing the invention, a support film is coated with a photosensitive layer. The photosensitive layer typically has a dry thickness of between about 0.05 mm and 0.25 mm, preferably about 0.06 mm to 0.15 mm. Such coating operations can be performed conventionally using the aqueous materials discussed above.

The photosensitive laminates of the invention are applied to the surface of an object for surface modification using adhesive properties of the laminate or the object surface. In one mode, an adhesive layer is applied either to the laminate or to the surface of the object in the appropriate location and the laminate is then adhered to the surface of the object using the adhesive layer. Such adhesive layers are typically aqueous dispersions of vinyl polymers containing effective amounts of tackifier and/or plasticizer materials that introduce pressure sensitive adhesive properties into an adhesive layer.

Alternatively, the photosensitive laminate of the invention can be formulated with a top layer having inherent adhesive properties. In this regard, additive materials can be introduced into the formulation for forming the photosensitive laminate that imparts pressure sensitive properties to the photosensitive material. In one implementation, the photosensitive materials contain a polyvinyl acetate emulsion that provides sufficient pressure sensitive adhesive properties such that the layer can be sufficiently bonded to the surface of the object to maintain the laminate in a place for a sufficient amount of time to modify the surface with sandblasting or other surface modifying processes.

The photoresist laminate articles of the invention are typically used by adhering an imaged laminate structure to the surface of an object in order to introduce patterns of modifications into or on the surface. Such patterns can be made using the laminate structures of the invention in a variety of methods resulting in the desired shape and depth of the pattern. Typically, a mask with a desired image is then applied to the side of the laminate comprising the second photoimageable layer. The second layer is then imagewise exposed to actinic radiation passing through the mask leaving a latent image in the photoimageable layer. The imaged layer is then developed and washed conventionally. The layer can then be applied to a surface, the support layer is removed and is then etched or sandblasted with particulates.

Any customary light source can be used for exposure of the photosensitive composition so long as it emits light having a wavelength at which the photosensitive resin can crosslink. Examples include an ultra-high-pressure mercury lamp, a high-pressure mercury lamp, a xenon lamp, a metal halide lamp, and a chemical lamp. Any customary exposure method can be employed such as a magnification- or reduction-projection exposure method, a contact exposure method, or a proximity exposure method.

The photosensitive laminates can be developed an aqueous solution, including a solution containing an acid, an alkali, a pH-adjusting agent, a surfactant and other ingredients. Examples of the development methods include spray-development, dipping-development, paddle-development, etc.

Figure 2:
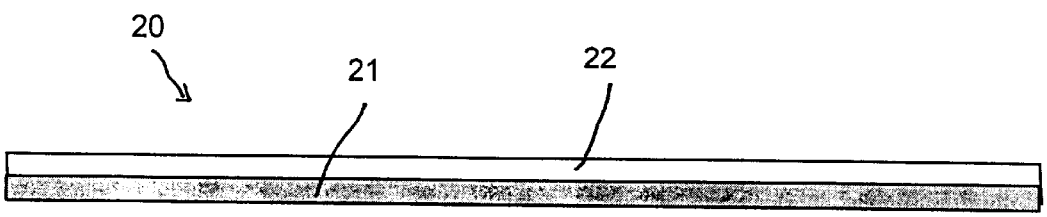
FIG. 2 is a view of a generally rectangular portion of a two layer laminate containing a carrier layer and a photosensitive layer.

Now, in reference to the figures, FIG. 1 shows an embodiment of the photosensitive laminate structure 10 of the invention. In laminate 10, a support or carrier layer comprising typically a polyester film 11 is shown. Coated on film 11 is a first relatively thin release membrane 12 and a photosensitive layer 13. FIG. 2 shows a two layer laminate 20 of the invention comprising a carrier layer 21 and a photosensitive layer 22.

Prior to photoimaging and developing, the photosensitive layer of the laminate exhibits dry tack and cohesion sufficient to maintain dimensional stability and to form a dry film layer in the laminate. After photoimaging and developing, the photosensitive layer of the photosensitive laminate exhibits sufficient ductility and flexibility to withstand physical handling. To achieve these goals, the photosensitive laminate preferably comprises a photosensitive component, a binding resin, and a plasticizer. Appropriate levels of these materials are provided in Table 1 and Table 2 below, which express the levels first as a percent by weight of solids in solution and then by percent by weight of the ingredient in dry photosensitive layer. It will be appreciated that a composition can satisfy either table to fall within the scope of the invention. Thus, for example, even if a solution is more dilute than the weight percent indicated in Table 1, it may still be dried to obtain the dry weight percent levels indicated in Table 2.

TABLE 1

Coating Emulsion Percents by Weight

| Ingredient | Typical | Preferred | More Preferred |
| --- | --- | --- | --- |
| photosensitive resin | 0 to 50 | 10 to 40 | 15 to 30 |
| binder resin | 50 to 80 | 60 to 70 | 63 to 67 |
| plasticizer | 0 to 15 | 5 to 10 | 7 to 9 |

TABLE 2

Dry Film Percents by Weight

| Ingredient | Typical | Preferred | More Preferred |
| --- | --- | --- | --- |
| photosensitive resin | 2 to 10 | 3.5 to 9.5 | 5 to 8.0 |
| binder resin | 65 to 98 | 70 to 85 | 75 to 80 |
| plasticizer | 0 to 25 | 12.5 to 18.5 | 15 to 19 |

Table 1 and 2 are offered to guide the practitioner in formulating photoimageable, adhesive film layers. Indeed, the practitioner may decide that it is advantageous to operate in a "Useful" range for one component while operating in a "More Preferred" range for another.

The mask laminate of the present invention preferably also includes a carrier layer which is strippable from and adjacent to the support layer and a removable protectable layer adjacent to the pressure sensitive layer to render the laminate non-tacky during handling and processing. The carrier layer should contact the support membrane with the surface having relatively low surface energy to render it strippable or peelable from the support membrane. This can be achieved by coating a film with a thin layer of a release agent or release liner such silicone, electron beam cured release coating, polytetrafluoroethylene (PTFE), or a UV curable release coating. The surface of these films has a low surface energy which allows them to be stripped from the support layer. Preferably, the release liner comprises a polyolefin film such as polypropylene or polyethylene or a polyester film such as polyethylenetetrathalate (PET) or a MYLAR film.

The invention is further described below by resort to several examples describing various aspects of the present invention, and preparation and use of the sandblast mask laminate.

EXAMPLES

The following specific examples are used to further illustrate the invention. These examples are merely illustrative of the invention and do not limit its scope. The mixtures were made by weighing each of the ingredients into a mixing vat. The ingredients were mixed using an overhead mixing system with a standard propeller. The resulting mixtures exhibited good film-forming and adhesive properties and were photoimageable.

Photosensitive laminates were formed using the compositions of Example 1 and comparative Example 2. Masks were prepared by exposing each laminate to a 20 watt blacklight source using a photopositive tool.

Drying

The masks were developed with warm water from a flat spray and then air dried after blotting the masks on a lint-free towel. The material from Example 1 dried 50 percent faster than the material from comparative Example 2 under conditions of 70° to 80° F. and a relative humidity of approximately 15 to 25 percent.

Adhesion to Carrier Sheet

After both laminates had dried they were placed onto a substrate and adhered using a water-soluble adhesive. The laminates were pressed down to provide good adhesion to the substrate, after which the carrier sheet was removed. The carrier sheet exhibited less adhesion to the composition of Example 1 than to the compositions of the comparative Example 2.

Abrasion Resistance

The laminates were blasted using 180 grit silicon carbide abrasive at 30 psi from a pressure pot sandblasting machine. The laminate from Example 1 showed a deeper blast depth into the substrate than was evident with the laminate from comparative Example 2.

Mask Removal

The laminates of Example 1 and comparative Example 2 where removed from the substrates after being sandblasted with the silicon carbide abrasive. The laminate of Example 1 was readily removed by peeling from the substrate as an intact or substantially intact film. The laminate of comparative Example 2 was gummy and could not be pulled from the substrate as an intact film.

| Ingredient (and approx. solids %) | Identifier and Source | Solution WT % | Dry Film WT % |
|---|---|---|---|
| Example 1 - Coating Emulsion Contents | | | |
| photosensitive resin (13% solids) | RTP-1001 from Toyo Gosei Kogyo, Ltd., Chiba, Japan. | 20 | 6.30 |
| polyvinyl alcohol (12–13% solids) | PVA 540 from AirProducts | 15.3 | 4.68 |
| surfactant | Fluorad FC-170C from 3M Company of St. Paul, Minnesota | 0.12 | 0.27 |
| pigment | Unisperse Red RBS-PI from Ciba-Geigy | 0.22 | 0.22 |
| isopropanol | — | 1.67 | — |
| polyvinyl acetate (52 to 56% solids) | PN-3178Z from HB Fuller | 40.71 | 54.29 |
| polyvinyl acetate (52 to 56% solids) | XR-2223 from HB Fuller | 8.74 | 11.66 |
| polyvinyl acetate (52 to 56% solids) | Airflex 320 from AirProducts | 8.74 | 11.66 |
| plasticizer | Benzoflex 50 from Velsicol Chemical Corporation of Rosemount, Illinois | 4.5 | 10.91 |
| Comparative Example 2 - Coating Emulsion Contents | | | |
| photosensitive resin (13% solids) | SPPH13 from Toyo Gosei Kogyo, Ltd., Chiba, Japan | 16.72 | 4.12 |
| polyvinyl acetate (52 to 56% solids) | XR2223 from HB Fuller | 54.90 | 57.36 |
| water | — | 5.59 | — |
| violet dye | from Keystone Aniline Corporation of Chicago, Illinois | 0.04 | 0.08 |
| surface conditioner | Slip-Ayd, SL-300 from Daniel Products | 4.02 | 3.06 |
| UV absorber | Tinuvin 1130, Ciba Geigy | 0.67 | 1.27 |
| plasticizer (100% solids) | Benzoflex 50 from Velsicol Chemical Corporation of Rosemount, Illinois | 17.85 | 33.90 |
| surfactant | Fluorad FC-170C from 3M Company of St. Paul, Minnesota | 0.12 | 0.21 |

Paint Resistance

The laminates of Example 1 and comparative Example 2 were exposed to quick drying paints such as solvent-based spray paints. The laminate from Example 1 remained resistant to the paints and retained its structural integrity. The laminate from comparative Example 2 was softened and became gummy upon exposure to the paint, and was therefore difficult to remove from the substrate.

The foregoing description, examples, methods of use and other disclosures in the specification provide a basis for understanding the laminate materials and the operation of the invention. However, since many embodiments of the invention can be made without departing from the spirit or scope of the invention, the invention resides in the claims hereinafter appended.

We claim:

1. A photosensitive laminate structure comprising:
a carrier layer; and
a photosensitive layer comprising:
(a) a polymeric photosensitive resin composition containing at least one cross-linkable unit represented by the formula:

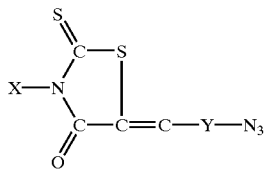

wherein X is an organic moity and Y is selected from the following group:

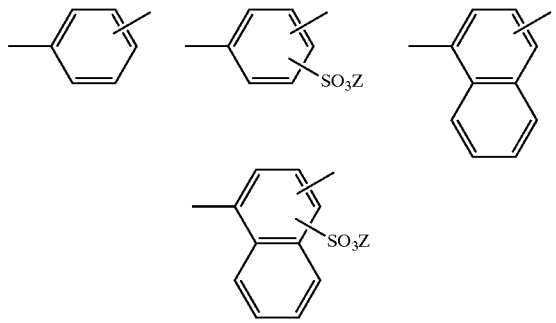

wherein Z is selected from at least one of lithium, sodium, potassium, ammonium, monoalkylammonium, dialkylammonium, and tetraalkylammonium; and
(b) polyvinyl acetate;
wherein the photosensitive layer comprises from 2 to 10 weight percent of the polymeric photosensitive resin and from 65 to 98 weight percent of the polyvinyl acetate based upon the total dry weight of the photosensitive layer.

2. The photosensitive laminate according to claim 1, wherein the cross-linkable unit comprises:

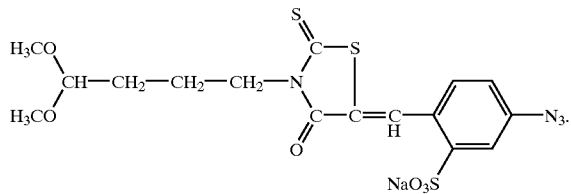

3. The photosensitive laminate according to claim 1, wherein the cross-linkable unit is appended to a poly(vinyl alcohol) polymer.

4. The photosensitive laminate according to claim 1, further comprising polyvinyl alcohol.

5. The photosensitive laminate according to claim 1, wherein the photosensitive layer comprises from 5 to 8 weight percent of the polymeric photosensitive resin and from 75 to 80 weight percent of the polyvinyl acetate based upon their combined weights.

6. The photosensitive laminate according to claim 1, wherein the photosensitive layer comprises from 2 to 10 weight percent of the polymeric photosensitive resin, from 65 to 98 weight percent of the polyvinyl acetate, and from 0 to 25 weight percent of polyvinyl alcohol based upon their combined weights.

7. The photosensitive laminate according to claim 1, wherein the photosensitive layer has a dry thickness of less than 0.25 mm.

8. The photosensitive laminate according to claim 1, further comprising a release membrane positioned between the carrier layer and photosensitive layer.

9. A photosensitive laminate structure comprising:
a carrier layer;
a release layer; and
a photosensitive layer, the photosensitive layer comprising:
(a) at least 5 percent by weight of a polymeric photosensitive resin composition containing at least one cross-linkable unit represented by the formula:

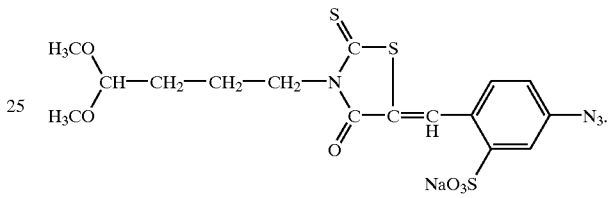

and
(b) at least 75 percent by weight of a polyvinyl acetate.

10. The photosensitive laminate structure according to claim 9, wherein the photosensitive layer further comprises at least 10 percent by weight polyvinyl alcohol.

11. The photosensitive laminate structure according to claim 9, wherein the photosensitive layer is less than 0.25 mm thick.

12. A photoimaging process comprising:
(a) exposing a photosensitive laminate to actinic radiation, the laminate comprising a carrier layer; a release layer; and a photosensitive layer, the photosensitive layer comprising:
(i) at least 5 percent by weight of a polymeric photosensitive resin composition containing at least one cross-linkable unit represented by the formula:

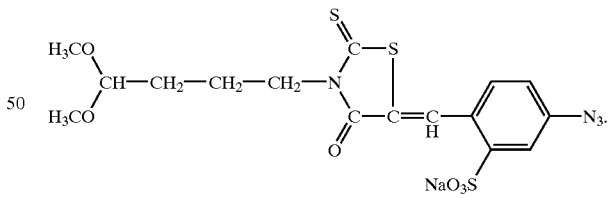

and
(ii) at least 15 percent by weight of a polyvinyl acetate.
(b) removing from the laminate those portions of the photosensitive layer that have not been exposed to actinic radiation;
(c) applying the laminate to a substrate; and
(d) selectively etching the substrate using an abrasive material.

13. The photoimaging process according to claim 12, wherein the photosensitive layer further comprises a polyvinyl alcohol.

* * * * *